United States Patent [19]

Sasaki

[11] 4,236,114
[45] Nov. 25, 1980

[54] APPARATUS FOR GENERATING PULSE WIDTH MODULATED WAVES

[75] Inventor: Minoru Sasaki, Tokyo, Japan

[73] Assignee: Tokyo Shibaura Electric Co., Ltd., Kawasaki, Japan

[21] Appl. No.: 872,118

[22] Filed: Jan. 25, 1978

[30] Foreign Application Priority Data

Jan. 28, 1977 [JP] Japan .................................. 52/8373

[51] Int. Cl.² .......................... H03K 3/78; H03K 7/08; H03K 21/10; H03K 21/36
[52] U.S. Cl. ........................................ 328/58; 328/37; 328/48; 328/61; 328/133; 307/216
[58] Field of Search ................... 328/41, 42, 37, 133, 328/134, 130, 48, 58; 307/216, 224 R

[56] References Cited

U.S. PATENT DOCUMENTS

| | | | |
|---|---|---|---|
| 3,725,791 | 4/1973 | Moreau et al. | 328/41 |
| 3,742,381 | 6/1973 | Hurd | 328/37 X |
| 3,818,354 | 6/1974 | Tomisawa et al. | 328/41 |
| 3,906,374 | 9/1975 | Fletcher et al. | 328/41 |
| 4,001,699 | 1/1977 | Denny et al. | 328/37 X |

FOREIGN PATENT DOCUMENTS

51-80101 7/1976 Japan ............................. 328/41

*Primary Examiner*—John S. Heyman
*Attorney, Agent, or Firm*—Oblon, Fisher, Spivak, McClelland & Maier

[57] ABSTRACT

A comparator is provided to produce a coincidence pulse when the combination of respective stages of a first counter which counts a first clock pulse coincides with the combination of respective stages of a second counter which counts a lower second clock pulse. Furthermore, there is provided a flip-flop circuit which is set when the combination of the outputs of the first counter becomes a predetermined state and reset by the coincidence pulse thereby producing a pulse width modulated wave whose pulse width varies gradually with time. Each of the first and second counters comprises a shift register including a plurality of serially connected binary memory elements which sequentially shift an input data. Each shift register includes a feedback circuit which feeds back the outputs of predetermined ones of the binary memory elements to the first stage memory element through an exclusive OR gate circuit.

2 Claims, 4 Drawing Figures

APPARATUS FOR GENERATING PULSE WIDTH MODULATED WAVES

BACKGROUND OF THE INVENTION

This invention relates to apparatus for generating a pulse width modulated wave which generates a pulse train whose pulse width gradually increases with time.

The principle of the apparatus for generating a pulse width modulated wave of the type just described is well known. That is, a combination of the outputs from respective stages of a first counter which counts a first clock pulse and a combination of the outputs from respective stages of a second counter which counts a second clock pulse having a frequency lower than that of the first clock pulse are compared with each other by a comparator which produces an output when both combinations coincide with each other. Furthermore, an R-S flip-flop circuit is provided which is set when the combination of the outputs from respective stages of the first counter becomes a predetermined combination, for example when the outputs of all stages are "0" and reset by the output of the comparator. With this connection it is possible to produce from the flip-flop circuit a pulse train whose pulse width gradually increases with time. In the prior art apparatus described above, the first and second counters have been constituted by serially connecting a plurality of T type flip-flop circuit. In such a counter, there is a time difference between the outputs of the lower stages and the outputs of the higher stages. For this reason, the comparator produces not only a desired coincidence output pulse but also a not desired pulse having a narrow pulse width thus making it difficult to obtain a desired pulse width modulated wave. According to another prior art apparatus, an AND gate circuit is connected between the input and the output of a flip-flop circuit which constitutes each counter and the operating times of respective flip-flop circuits are synchronized by a clock pulse, and such counters are termed synchronous counters. The latter apparatus can eliminate the defect of the former apparatus, but as it requires the AND gate circuits for synchronization, it is necessary to increase the number of elements for one bit of the counter, thus complicating the construction. This drawback becomes remarkable for a counter having a large capacity of bits.

Accordingly, it is an object of this invention to provide an improved apparatus for generating a pulse width modulated wave capable of efficiently generating a desired pulse width modulated wave with a simple circuit construction.

SUMMARY OF THE INVENTION

According to this invention, there is provided apparatus for generating a pulse width modulated wave comprising a first counter for counting a first clock pulse; a second counter for counting a second clock pulse having frequency lower than the first clock pulse; a comparator which compares the outputs of respective stages of the first counter with the outputs of respective stages of the second counter for producing a coincidence output when all outputs of respectively corresponding stages coincide with each other; and a flip-flop circuit which is set each time the combination of the outputs of respective stages of the first counter becomes a predetermined state and reset by the coincidence output thereby producing a pulse width modulated wave whose pulse width varies with time; each of the first and second counters comprising a shift register including a plurality of serially connected binary memory elements, thus sequentially shifting an input data; and each shift register including feedback means for feeding back the outputs of selected ones of the binary memory elements as the input data to the input of a first stage binary memory element through an exclusive OR gate circuit.

DESCRIPTION OF THE PREFERRED EMBODIMENTS

Figure 1:
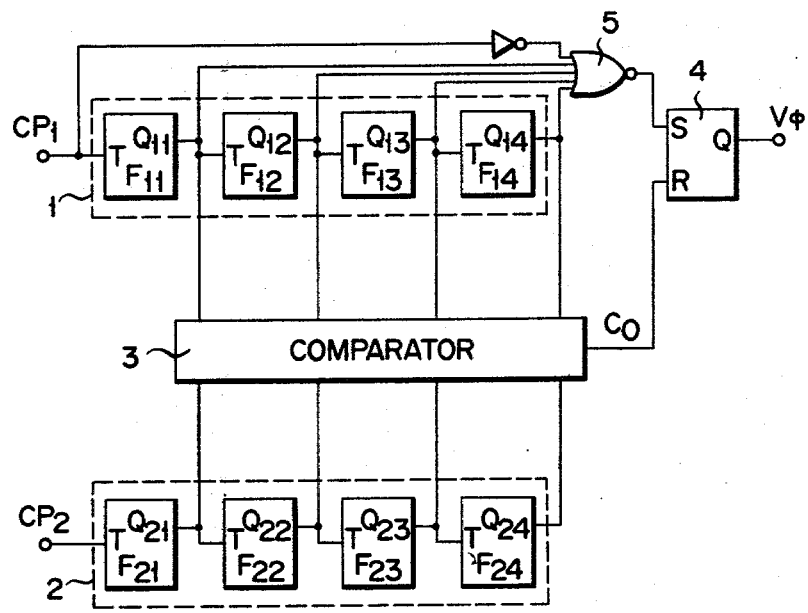
FIG. 1 is a block diagram showing prior art apparatus for generating a pulse width modulated wave.
Figure 2:
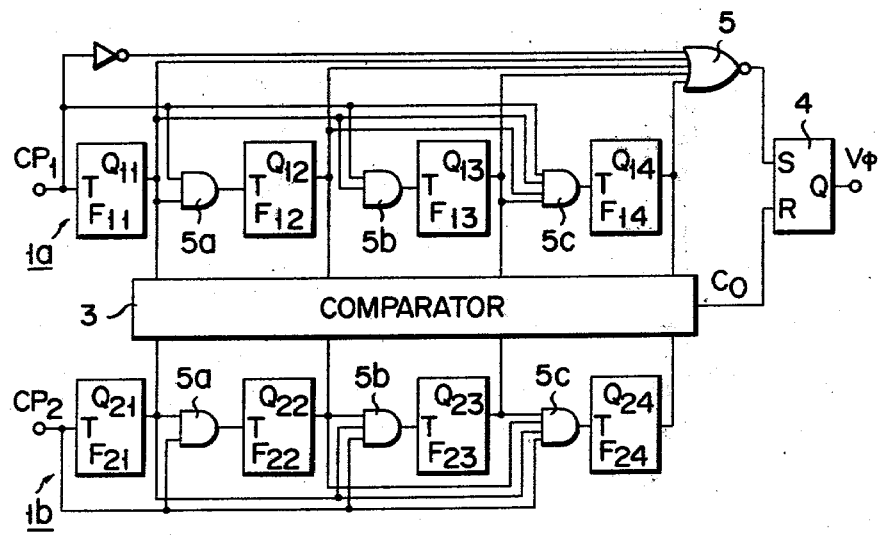
FIG. 2 is a block diagram showing another prior art apparatus for generating a pulse width modulated wave.

To have better understanding of this invention the outline of the prior art apparatus shown in FIGS. 1 and 2 will firstly be described. In the apparatus shown in FIG. 1, a first counter 1 counts a first clock pulse $CP_1$ having a predetermined frequency, while a second counter 2 counts a second clock pulse $CP_2$ having a frequency much lower than that of the first clock pulse. The comparator 3 is provided to compare outputs of respective stages of the first and second counters for producing a coincidence output $C_0$ when the outputs of respective stages coincide with each other. An NOR gate circuit 5 produces an output "1" when the combination of the outputs of respective stages of the first counter becomes a predetermined combination, for example when the outputs of all states become "0" for setting an RS flip-flop circuit 4, thus producing an "1" output $V_\phi$. This flip-flop circuit 4 is reset by the coincidence output $C_0$ to produce a "0" output.

For example, each of the counters 1 and 2 comprises a four bit binary counter and it is assumed now that the combination of the outputs of the respective stages of counter 2 is expressed by "0110". Then, when six clock pulses $CP_1$ are applied to the first counter 1, the combination of the outputs thereof will also become "0110" so that the output $C_0$ of the comparator 3 becomes "1". Accordingly, the output $V_\phi$ of the flip-flop circuit $CP_1$ will have a rectangular waveform in which the duration of the binary "1" corresponds to six cycles of the clock pulse $CP_1$, whereas the duration of the binary "0" corresponds to ten cycles of the clock pulse $CP_1$. In other words, the ratio between the durations of "1" and "0" output states of the flip-flop circuit 4 varies dependent upon the state of the combination of the outputs of respective stages of the counter 2. More particularly, when the number of pulses supplied to the counter 2 is denoted by n the ratio between the durations of the "1" and "0" states of the output $V_\phi$ is expressed by n:(16-n). In this manner, each time the clock pulse $CP_2$ is supplied to the counter 2, a pulse width modulated wave appears as the output $V_\phi$ whose pulse width (duration of "1") increases gradually.

The apparatus, shown in FIG. 1, however, has the following defects. More particularly, the counters 1 and 2 comprise cascade connected T type flip-flop circuits $F_{11}$ through $F_{14}$ and $F_{21}$ through $F_{24}$ respectively so that time delays are created between their inputs and outputs. In other words, time differences are created between respective outputs $Q_{11}$ through $Q_{14}$ and outputs $Q_{21}$ through $Q_{24}$. Accordingly, in addition to the desired coincidence output $C_0$ which is generated when the combinations of the outputs of counters 1 and 2 coincide with each other, undesired narrow width outputs are also produced as the outputs due to the time differences between the outputs of respective stages, thus failing to produce the desired pulse width modulated wave.

The pulse width modulated wave generating apparatus shown in FIG. 2 has been proposed for the purpose of obviating the defect described above. The first counter $1a$ of this apparatus comprises a so-called synchronous counter in which AND gate circuits $5a$ through $5c$ are interposed respectively between adjacent flip-flop circuits $F_{11}$ through $F_{14}$ for synchronizing the trigger inputs of respective flipflop circuits $F_{11}$ through $F_{14}$. The second counter $1b$ is constructed similarly. With this construction, the output $C_0$ of comparator 3 becomes "1" only when the combinations of the outputs of both counters $1a$ and $1b$ coincide with each other.

However, since the apparatus shown in FIG. 2, requires to add AND gate circuits $5a$ through $5c$ for the purpose of synchronization, the number of component elements necessary to construct the apparatus for generating the pulse width modulated wave increases, thus complicating the circuit construction. Especially, when the number of bits of respective counters increases, this disadvantage becomes remarkable.

According to this invention, shift registers each comprising a plurality of binary memory elements and feedback means are used as the first and second counters. Such counters are used as random pulse generators and known as maximum length linear feedback shift registers. The counter of this type can produce a maximum of $(2^N-1)$ output combinations, where N represents the number of the binary memory elements. The combination of the outputs of such counter is not regular as the output combinations of a binary counter. However, the output combinations of the first and second counters having the same feedback are the same so long as the numbers of the input clock pulses are the same. Since in the apparatus of this invention, a pulse width modulated wave is obtained by comparing the output combinations of two counters applied with input clock pulses having different frequencies, the object of this invention can be attained by using two counters which produce outputs of the same combination for the input clock pulses of the same number.

Figure 3:
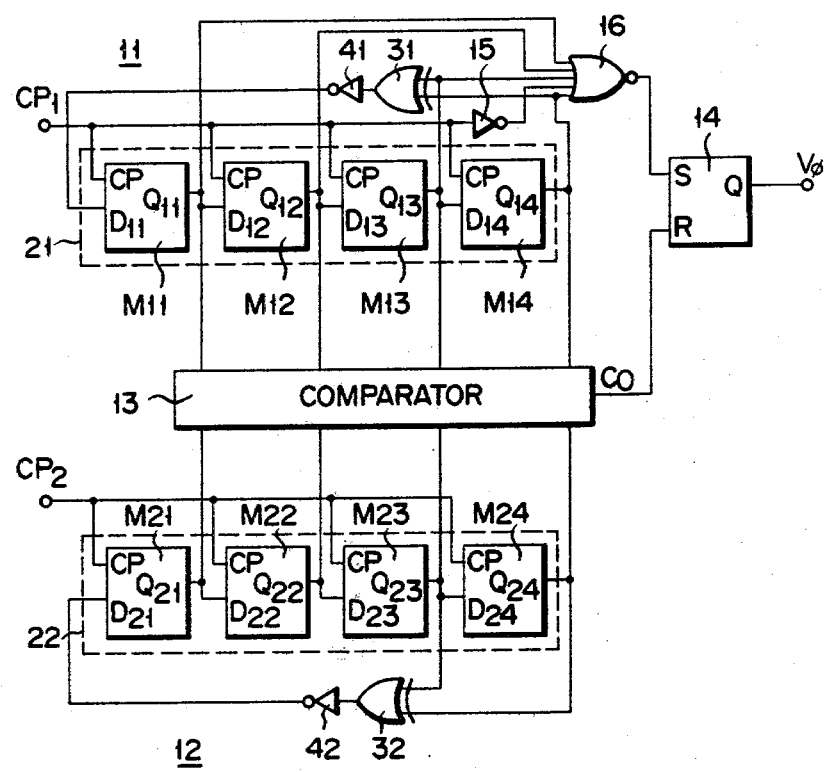
FIG. 3 is a block diagram illustrating one embodiment of the apparatus for generating a pulse width modulated wave according to this invention.

In a preferred embodiment of this invention shown in FIG. 3, counters 11 and 12 comprise four bit shift registers 21 and 22. These counters comprise binary memory elements, for example D type flipflop circuits $M_{11}$ through $M_{14}$, and $M_{21}$ through $M_{24}$ respectively, and shifted by first and second clock pulses $CP_1$ and $CP_2$ respectively. The frequency of the second clock pulse $CP_2$ is selected to be sufficiently lower than that of the first clock pulse $CP_1$. For example, one clock pulse $CP_2$ is supplied to the second counter 12 each time the first counter 11 is circulated once by the clock pulse $CP_1$. As shown, the outputs $Q_{11}$ through $Q_{13}$ and $Q_{21}$ through $Q_{23}$ of respective binary memory elements $M_{11}$ through $M_{13}$ and $M_{21}$ through $M_{23}$ are connected to the data input terminals $D_{12}$ through $D_{14}$ and $D_{22}$ through $D_{24}$ of the succeeding binary memory elements. The outputs of respective stages of the shift registers 21 and 22 are applied to a comparator 13. The outputs $Q_{13}$ and $Q_{14}$ of the third and fourth memory elements $M_{13}$ and $M_{14}$ of the first register 21 are applied to the inputs of an exclusive OR gate circuit 31 with its output fed back to the data input terminal $D_{11}$ of the first stage binary memory element $M_{11}$ through an inverter 41. The inverter 41 can be omitted if the inputs of the exclusive OR gate circuit are $\overline{Q}_{13}$ and $Q_{14}$ or $Q_{13}$ and $\overline{Q}_{14}$. In the same manner, the outputs $Q_{23}$ and $Q_{24}$ of the third and fourth stages of the second shift register 22 are applied to the inputs of an exclusive OR gate circuit 32 and its output is fed back to the input terminal $D_{21}$ of the first stage binary memory element $M_{21}$. The outputs of respective stages of the first and second shift registers are compared with each other by comparator 13 and when the output combinations of both registers coincide with each other, a coincidence output $C_0$ is produced. The first shift register 21 is provided with an NOR gate circuit 16 connected to receive the outputs $Q_{11}$, $Q_{12}$, $Q_{13}$ and $Q_{14}$ of the binary memory elements $M_{11}$ through $M_{14}$ and clock pulse $CP_1$ inverted by an inverter 15. The output of the NOR gate circuit 16 is connected to the set terminal S of a flip-flop circuit 14. Thus, this flip-flop circuit 14 is set by the clock pulse $CP_1$ when the output combination of the first counter 11 is at predetermined states, that is, all "0" in the case shown in FIG. 3 but reset when the output $C_0$ of the comparator becomes "1".

Figure 4:
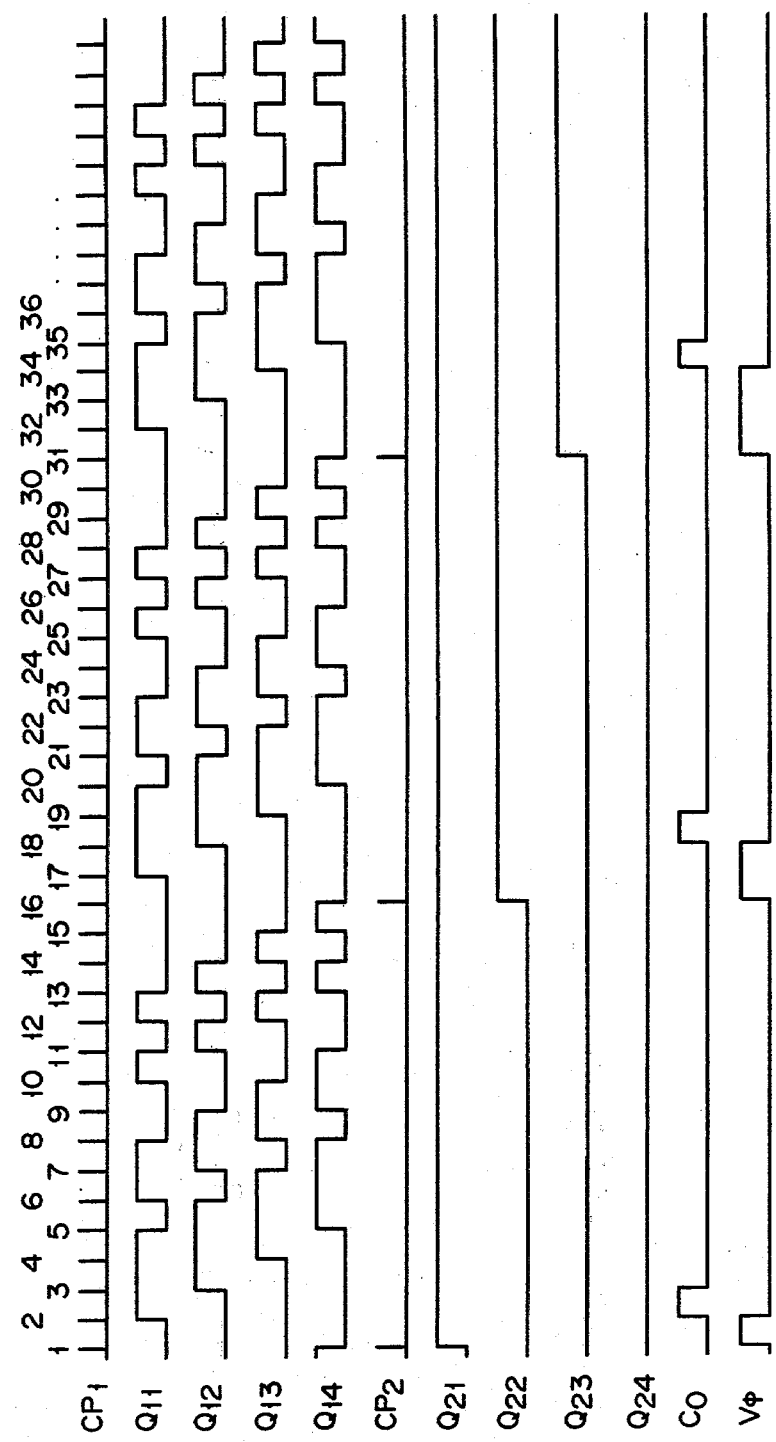
FIG. 4 shows waveforms at various portions of the circuit shown in FIG. 3.

The operation of the apparatus shown in FIG. 3 will now be described in detail with reference to FIG. 4. When the clock pulse $CP_1$ is applied, the output $Q_{11}$ of the first counter 11 varies in a manner of "0", "1", "1", "1"... as shown in curve $Q_{11}$, in FIG. 4. As shown by curves $Q_{12}$, $Q_{13}$ and $Q_{14}$, the outputs $Q_{12}$, $Q_{13}$ and $Q_{14}$ are sequentially shifted by clock pulse. As can be seen from these curves, there are 15 combinations of the outputs $Q_{11}$ through $Q_{14}$. The outputs $Q_{21}$ through $Q_{24}$ of the second counter 12 vary in the same manner in response to the input clock pulse $CP_2$.

As above described, it is assumed that one clock pulse $CP_2$ is applied to the second counter 12 each time the count of the first counter 11 completes one circulation. In other words, it is assumed that the clock pulse $CP_2$ is applied to the second counter when all outputs of the first counter 11 become "0" and the output of the NOR gate circuit 16 becomes "1". Then, the clock pulse $CP_2$ would be applied to the second counter at the first, 16th, 31th... clock pulses $CP_1$, and the flip-flop circuit 14 is set at these times to produce "1" output (see curves $CP_2$ and $V_\phi$, FIG. 4). At the time of the first clock pulse $CP_1$, the combination of the outputs $Q_{21}$ through $Q_{24}$ of the second counter becomes "1", "0", "0", "0". As above described, however, the combination of the outputs $Q_{11}$ through $Q_{14}$ of the first counter 11 becomes "1", "0", "0", "0" at the second clock pulse $CP_1$. At this time, since the output $C_O$ of the comparator 13 is "1", the flip-flop circuit 14 is reset. Accordingly, the waveform of the output $V_\phi$ is a rectangular wave which is "1" during one clock pulse $CP_1$ whereas "0" during an interval corresponding to 14 clock pulses $CP_1$. At the 16th clock pulse $CP_1$, as the second clock pulse $CP_2$ is applied, the combination of the outputs $Q_{21}$ through $Q_{24}$ of the second counter 12 become "1", "1", "0", "0" while at the same time, the output $V_\phi$ of the flip-flop circuit 14 becomes "1". At the 18th clock pulse $CP_1$, the combination of the outputs $Q_{11}$ through $Q_{14}$ of the first counter 11 becomes "1", "1", "0", "0" which is equal to the combination "1", "1", "0", "0" of the outputs $Q_{21}$ through $Q_{24}$ of the second counter 12 so that the flip-flop circuit 14 will be reset by the output $C_O$ of the comparator 13. Accordingly, the waveform of the output $V_\phi$ of the flip-flop circuit 14 is a rectangular wave which is "1" during an interval corresponding to two clock pulses $CP_1$ and "0" during an interval corresponding to 13 clock pulses. In the same manner, the flip-flop circuit 14 is set at the 31th clock pulse $CP_1$ and reset at the 34th clock pulse $CP_1$, so that the waveform of the output $V_\phi$ is a rectangular wave which is "1" during an interval corresponding to three clock pulses $CP_1$ and "0" during an interval corresponding to 12 clock pulses $CP_1$. Consequently, the flip-flop circuit 14 produces a rectangular output having a duty cycle of $n:(15-n)$, where n represents the number of clock pulses $CP_2$ applied to the second counter 12. In this manner, it is possible to obtain a pulse width modulated wave whose pulse width increases with time.

Generally, where a predetermined feedback is applied to the first and second shift registers respectively having N bits, it is possible to obtain a maximum of $(2^N-1)$ combinations of the outputs and a rectangular output $V_\phi$ having a duty cycle of $\{n:(2^N-1-n)\{$. The method of applying the feedback is not limited to that shown in the drawing but can be modified depending upon the member of bits. Also the number of combinations of the outputs may be smaller than $(2^N-1)$.

According to this invention, since the output of each binary memory element is produced in perfect synchronism with the input clock pulse it is possible not only to completely eliminate the defects of the prior art apparatus shown in FIG. 1 but also to eliminate the defects of the apparatus shown in FIG. 2 since the construction of the binary memory elements is simpler than that of flip-flop circuit. The T type flip-flop circuit utilized in a conventional counter has a function of a feedback circuit whether it is of a master slave type or a six AND gate type. In contrast, the binary memory element of the shift registers utilized in this invention may be a memory element which is not provided with a feedback loop such as a D type flip-flop circuit in which the signal flows unidirectionally. As a consequence, when fabricating the apparatus of this invention with integrated circuits it is possible not only to increase the freedom of arranging the binary memory elements on the integrated circuit chips but also decrease the spaces for wiring. It will be noted that such decrease in the wiring space is advantageous when one appreciates the fact that the wiring space amounts to about 70% of the total space of a logic integrated circuit.

What is claimed is:

1. An apparatus for generating a pulse width modulated wave comprising:
   a first shift register including a plurality of serially connected binary memory stages for sequentially shifting an input data item in synchronism with a first clock pulse, said first shift register including feedback means for feeding back the outputs of selected ones of said binary memory stages as said input data item to the input of said first binary memory stage through an exclusive OR circuit;
   a second shift register including the same number of serially connected binary memory stages as those of said first shift register for sequentially shifting an input data item in synchronism with a second clock pulse which has a frequency lower than said first clock pulse, said second shift register also including feedback means for feeding back the outputs of the same selected binary memory stages of said second shift register as those of said first shift register as said input data item to the input of said first binary memory stage of said second shift register through an another exclusive OR circuit;
   a comparator which compares the output of each stage of said first shift register with the output of the corresponding stage of said second shift register for producing a coincidence output when all outputs of the stages of said first shift register coincide with the outputs of the corresponding stages of said second shift register; and
   a flip-flop circuit which is set every time the combination of the outputs of respective stages of first shift register comes into a predetermined state and which is reset by said coincidence output, thereby producing a pulse width modulated wave whose pulse width varies gradually with time.

2. An apparatus for generating a pulse width modulated wave, comprising:
   a first shift register including a plurality of serially connected binary memory stages for sequentially shifting an input data item in synchronism with a first clock pulse, said first shift register including feedback means for feeding back the outputs of selected ones of said binary memory stages as said input data item to the input of said first binary memory stage through an exclusive OR circuit;
   a second shift register including the same number of serially connected binary memory stages as those of said first shift register for sequentially shifting an input data item in synchronism with a second clock pulse which has a frequency lower than said first clock pulse, said second shift register also including feedback means for feeding back the outputs of selected ones of said binary memory stages as said input data item to the input of said first binary memory stage of said second shift register through an another exclusive OR circuit;
   a comparator which compares the outputs of respective stages of said first shift register with the outputs of respective stages of said second shift register for producing a coincidence output when all outputs of the stages of said first shift register coincide with the outputs of the corresponding stages of said second shift register; and
   a flip-flop circuit which is set every time the combination of the outputs of respective stages of first shift register comes into a predetermined state and which is reset by said coincidence output, thereby producing a pulse width modulated wave whose pulse width varies gradually with time,
   wherein said first and second shift registers each comprise first to fourth binary memory stages each provided with a data input terminal, a data output terminal and a clock terminal connected to receive said first or second clock pulse; said exclusive OR gate circuit of said first shift register has inputs connected to receive the outputs of the third and fourth memory stages of said first register, the output of said exclusive OR gate circuit being supplied to the input of said first binary memory stage of said first shift register; said other exclusive OR gate circuit of said second shift register has inputs connected to receive the outputs of the third and fourth binary memory stages of said second shift register, the output of said other exclusive OR circuit being supplied to the input of said first binary memory stage of said second shift register; and said first shift register further comprises a NOR gate circuit with inputs connected to receive the outputs of respective binary memory stages of said first shift register and an inverted first clock pulse and an output connected to set said flip-flop circuit.

* * * * *